United States Patent
York et al.

(10) Patent No.: US 6,320,523 B1
(45) Date of Patent: Nov. 20, 2001

(54) METHOD AND APPARATUS FOR REDUCING THE TIME REQUIRED FOR COMPRESSING DATA

(75) Inventors: Kenneth Lindsay York; Thayer Lindsay York, both of Huntington Valley, PA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 09/364,427

(22) Filed: Jul. 30, 1999

(51) Int. Cl.$^7$ ................................................. H03M 7/00
(52) U.S. Cl. ......................................... 341/106; 341/51
(58) Field of Search ............................. 341/51, 106, 95, 341/87, 50, 67

(56) References Cited

U.S. PATENT DOCUMENTS

| | | | |
|---|---|---|---|
| 4,558,302 | * 12/1985 | Welch | 341/106 |
| 4,929,946 | * 5/1990 | O'Brien et al. | 341/87 |
| 5,016,009 | * 5/1991 | Whiting et al. | 341/67 |
| 5,049,881 | * 9/1991 | Gibson et al. | 341/51 |
| 5,151,697 | * 9/1992 | Bunton | 341/51 |
| 5,229,768 | 7/1993 | Thomas | 341/51 |
| 5,373,290 | * 12/1994 | Lempel et al. | 341/51 |
| 5,389,922 | * 2/1995 | Seoussi et al. | 341/51 |
| 5,455,576 | * 10/1995 | Clark, II et al. | 341/50 |
| 5,525,982 | * 6/1996 | Cheng et al. | 341/51 |
| 5,642,112 | * 6/1997 | Cooper | 341/51 |
| 5,646,617 | * 7/1997 | Ohmoto et al. | 341/51 |
| 5,798,718 | * 8/1998 | Hadady | 341/51 |

OTHER PUBLICATIONS

Solomon, D., "Data Compression: The Complete Reference", 1998, Springer–Verlag, Chapter 3, Appendix H, New York, NY.
P. 1 of International Search Report, dated Oct. 17, 2000.

* cited by examiner

Primary Examiner—Peguy JeanPierre
Assistant Examiner—Jean Bruner Jeanglaude
(74) Attorney, Agent, or Firm—John B. Sowell; Mark T. Starr

(57) ABSTRACT

The present invention provides a novel method and system for obtaining maximum system speed performance for compressing coded data characters in a serial data stream by replacing strings of data with code values stored in a dictionary when strings are first observed as unique strings in the data stream. A novel pointer address is generated to represent new strings to be searched in the dictionary. The novel pointer address comprises a string code portion representative of the last matched string found in the dictionary and appended thereto an extension character code portion representative of the next character taken from the input data stream. The dictionary is constructed large enough to provide a unique memory location for every possible pointer address. The unique pointer address, representative of a string of data in the input data stream, is employed as an address pointer to access the memory. If no data is in memory at the address pointer the string has not been previously observed and a new unique compression code is stored at the pointer address in memory for the string so that the next identical pointer address will read the code for the string from the dictionary. Accordingly, every memory address accessed in the dictionary with the unique address pointer immediately causes a HIT or a MISS in the dictionary. A HIT produces the last matched string code for generating a new address pointer indicative of a longer string when the extension character code is appended onto the last matched string code to provide the next new pointer address.

20 Claims, 9 Drawing Sheets

METHOD AND APPARATUS FOR REDUCING THE TIME REQUIRED FOR COMPRESSING DATA

BACKGROUND OF THE INVENTION

1. Field of Invention

The present invention relates to data compression systems. More particularly, the present invention relates to loss-less data compression and a method and means for increasing the speed of compressing a stream of data in systems that employ a dictionary to store string codes.

2. Description of the Prior Art

Heretofore, loss-less data compression algorithms were known. Some of the best known data compressions systems and methods are referred to as Lempel Ziv One (LZ-1) Lempel Ziv Two (LZ-2) and Lempel Ziv Welch (LZW). All of these adaptive loss-less data compression systems employ a dictionary for storing string codes that are indicative of strings of data and symbols or characters encountered in an input data stream. Once a string is identified it is stored as a code having fewer bits than the identified string of data so that subsequent occurrences of the same string in the data stream are replaced with the previously stored string code. All three above-mentioned data compression systems involve searching plural locations in the dictionary to determine if a string code has been previously stored for the string under examination. The process involves matching a sequence of input data characters with the same sequence already encoded in a dictionary location.

To minimize the time required for searching plural locations in the dictionary, it has been suggested that a hashing algorithm be used to perform the matching function. Hash searches compute an index in a table based on the data being sought. The efficiency of the hash table search is determined by the organization of the table and whether multiple items can hash to the same area of the table without conflict. Hashing systems suffer from high costs of implementations and complex computations which result in performance reducing overhead. One LZW hashing method is described in U.S. Pat. No. 4,558,302 which is incorporated by reference herein.

It has also been suggested that binary searches could be employed in which the memory and portions of the memory are divided and searched sequentially until a match or no match is found. Binary searches by definition require multiple searches in the dictionary and also require table reordering, but have the advantage that they reduce the overhead incurred in the complex calculations associated with hashing.

It has been suggested that a content addressable memory (CAM) or associative memory be employed to reduce the number of comparisons of the contents of plural strings located in the dictionary. This system is efficient, yet complex and it can be very costly. An example of this method is described in U.S. Pat. No. 5,838,264 which is incorporated by reference herein.

It would be desirable to provide a method and apparatus that completely avoids plural searches in data compression systems that employ string dictionaries. It is further desirable that the output from the new data compression system be formatable to be compatible with existing data compression systems such as LZW so that the existing decompressor/decoders would be able to receive and decode compressed data without any modification.

SUMMARY OF THE INVENTION

It is a principle object of the present invention to optimize the speed of data compression implemented with the use of a string dictionary.

It is another principle object of the present invention to eliminate the need for searching plural address locations in a string dictionary of a data compressor.

It is another principle object of the present invention to provide an LZW string dictionary arranged as a look up table having only one unique address for every possible novel string code so that a search in the dictionary is eliminated.

It is another principle object of the present invention to provide a novel data compression system that can be efficiently formatted to compress Chinese, Japanese and other complex character codes without the penalty of extensive searches in a string dictionary.

It is another principle object of the present invention to provide a data compression system that may be implemented using low cost random access memory (RAM) without placing a burden on the computing system.

It is another principle object of the present invention to provide a novel method of performing LZW data compression at speeds higher than was possible heretofore, thus, increasing real time throughput for high speed networks that have standardized on or employ string data compression such as LZW.

It is another object of the present invention to provide a new and improved method of performing LZW data compression that speeds up the process of compressing the data stream and provides a means for higher transmission rates over existing lines and links.

It is a principle object of the present invention to provide a novel expanded pointer address code for strings of data encountered in a data stream to be compressed.

It is a principle object of the present invention to provide a novel string dictionary having a greater number of accessible addresses than the maximum number of string codes being used in a full dictionary.

It is a principle object of the present invention to store a unique single string code value of fewer bits in a dictionary that is representative of the string of characters contained in the unique pointer address code of greater bits.

It is a principle object of the present invention to generate a compressed stream of data in LZW format without the need to search plural address locations in a string dictionary.

It is a principle object of the present invention to eliminate the need to store extension characters with string codes in an LZW dictionary.

It is the general object of the present invention to use the same LZW string dictionary a plurality of times without having to stop and clear the contents when the dictionary is full.

It is the general object of the present invention to purge or clear all or select portions of a string dictionary without reading over the contents of all memory locations.

It is the general object of the present invention to store the address locations of string codes in an auxiliary look up table to enable clearing by overwriting only those address locations where code data has been stored.

According to these and other objects of the present invention there is provided a method and apparatus for optimum high speed performance of data compression using a string dictionary which includes generating unique pointer addresses which comprise a string code portion and an extension code portion. The novel pointer address comprises a string code portion representative of the last string match found in the dictionary, and an extension character code portion representative of the next unknown character in the data stream appended to the string code portion. When the string code portion is defined by no more than 12 bits and the extension character code portion by 8 bits, then there are only $2^{20}$ possible pointer addresses. There are provided $2^{20}$ corresponding dictionary addresses so that only one address in the dictionary need be accessed in order to determine if the string representative of the pointer address has been previously observed and replaced by a string code stored in the dictionary at the pointer address.

DETAILED DESCRIPTION OF THE PREFERRED EMBODIMENT

Figure 1:
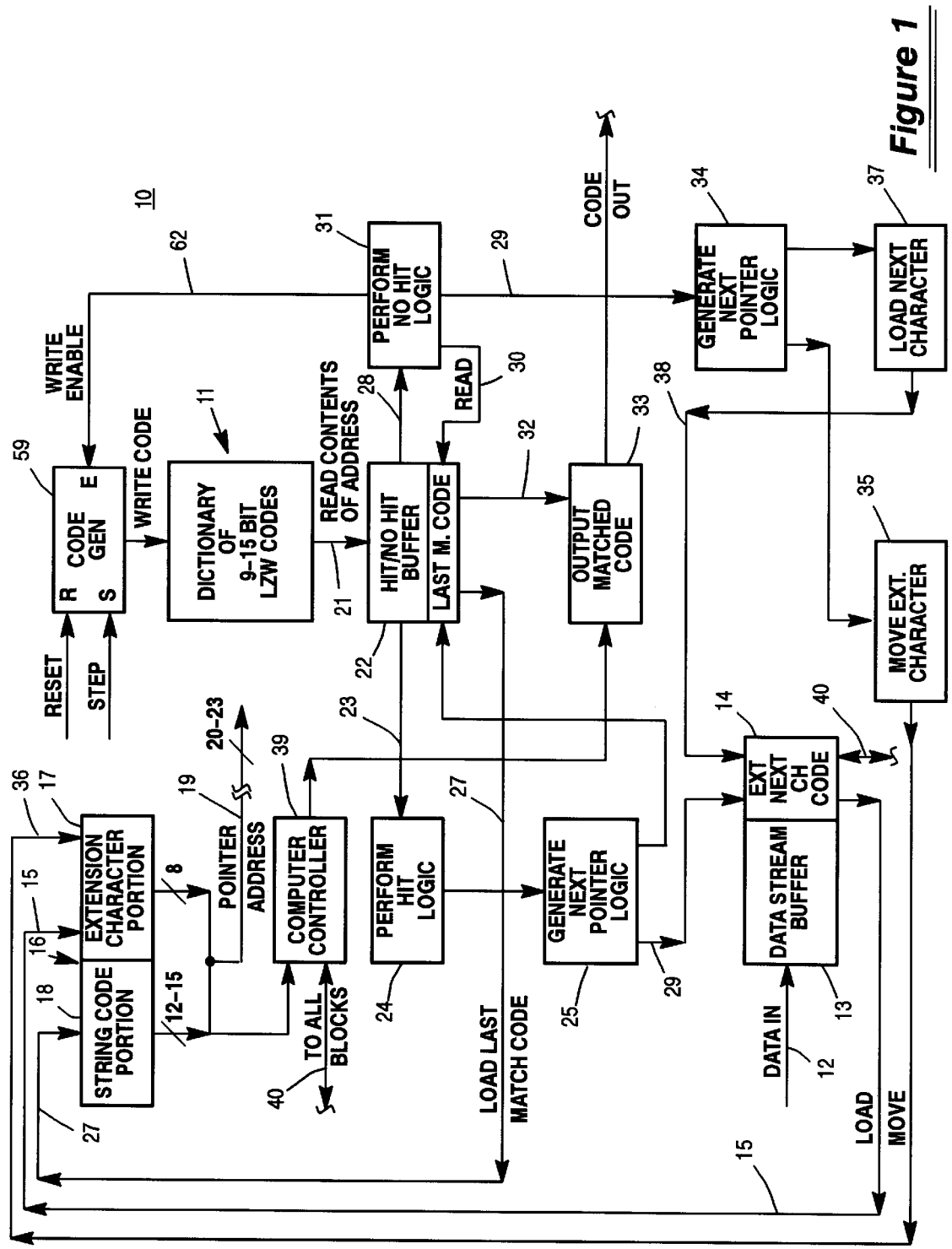
FIG. 1 is a schematic block diagram of the preferred embodiment data compression system for generating codes indicative of strings of alpha numeric characters or symbols found in the data stream.

Before referring to FIG. 1 and the preferred embodiment data compression system it should be understood that there is no single format for most data compression systems. Accordingly, both the compressor/transmitter and the receiver/decoder need to know: 1.) the character set to be used; 2) the maximum number of bits to be used to define the largest code value or field; 3) the special codes such as stop, reset, clear code, etc. and 4) the encoding data packing and separation scheme to be employed. If the data compressor and the decoder have already established the protocol to be used and the above-mentioned items are known there is no need to send such information in a preamble or header before starting data compression. In the preferred embodiment of the present invention when the transmitter and the receiver know the protocol items, it is possible to start the compression system 10 including the novel string dictionary 11 without initialization with a character set. However, it is possible to initialize the dictionary with a character set as used in conventional LZW data compression. The data compression system 10 includes an input line 12 for the input data stream which is buffered into a data stream buffer 13 having appended thereto an extractor 14 which takes the next character and outputs it onto line 15 where it is placed in the extension character code portion 17 of the pointer address register 16. There is already present in the address pointer register 16 a LZW string code in the LZW string code portion 18 which contains the code for the last matched string found in the data stream on line 12. Assume for the purposes for explanation that the LZW code portion contains 12 bits and the extension character portion 17 contains 8 bits, thus the dictionary pointer address on line 19 will contain 20 bits. The novel dictionary 11 will be provided with at least $2^{20}$ unique memory locations or addresses so that every possible dictionary pointer address has a memory location. When the dictionary is initialized every single character string will find a match which initiates compression of two character strings.

The dictionary pointer address on line 19 causes a read operation into the dictionary 11 and the contents at the pointer address appear on line 21 and are stored in a HIT/NO HIT buffer 22. Assume that a string code was present at the pointer address which causes the logic in buffer 22 to recognize that the string presently being examined has been seen before and a code has been has been substituted in dictionary 11 for the string. Thus, a HIT is observed on line 23 which causes the HIT logic 24 to generate a next pointer address in logic 25.

The pointer logic 25 enables the buffer 22 to produce on line 27 the last HIT code which is written into the string code portion 18 of the pointer address register 16. At the same time, the pointer logic produces an enable signal on line 29 which causes the character extractor 14 to produce the next character code on line 15 that is written into the extension character portion 17 of the pointer address register 16. The pointer address register 16 now contains the last HIT code read from the dictionary 11 and the extension character or next character taken from the data stream. The new pointer address on line 19 again reads the contents of the dictionary at the new pointer address and places the contents read in the HIT/NO HIT buffer register 22. This process continues until there is no longer a HIT code read from the dictionary 11 and the logic in the buffer register 22 produces a signal on line 28 to NO HIT logic 31. The NO HIT logic 31 reads via line 30 the last matched code from buffer register 22 onto line 32 and into a transmitter or receiver 33 which is indicated by a block 33 but may be a line for transmitting to a remote receiver. The NO HIT logic 31 via line 62 causes the code generator 59 to write the next sequential code into register 11 at the NO HIT pointer address. The NO HIT logic 31 also signals the system 10 via line 29 to generate a new pointer address at logic block 34. In order to generate a new pointer, logic 34 performs two sequential operations. The first operation shown at block 35 is to move the extension character in block 17 of register 16 into block 18 of register 16 as shown at line 36 connected to portion 17. The next sequential operation is to load the next character in the data stream via line 15 into the extension character portion 17. As shown at block 37 the logic produces an enable signal on line 38. If the character extraction block 14 has sensed that the last character has been read then the block 14 informs the computer controller logic at block 39 that the last character is being read at block 14 and this completes the end of the search logic.

To summarize the operation of the data compression system 10 in FIG. 1 it will now be observed that the input data stream constantly appends the next or latest character in the data stream from the extractor 14 onto the string code portion 18 from the last match read in block 22. The address pointer is generated by the two portions 17 and 18 on line 19 which causes the system to read the contents of the dictionary 11 at the unique pointer address. If there are contents at the address pointer location in this embodiment it contains the code for the match for the string indicated by the address pointer. If the string has a previous match then the string must be extended by one character and an attempt made to find a longer match. In order to do this the code just read from the dictionary 11 passes through buffer 22 and is loaded into the code portion 18 and the next character code from the data stream or the extension character is loaded into the portion 17 to generate a new pointer. This sequence of operations continues until there is no code read from the dictionary 11 which is indicative of a MISS or NO HIT. When this occurs a new code for the MISS is stored in the dictionary 11 at the pointer address and a new string must be started with the last character now in portion 17. Before starting the new string, the previous match code or last match code is transmitted to a receiver as shown as the logic block 33. Then the NO HIT logic 31 causes the pointer logic 34 to do two things. First the last character in the extension character portion 17 is moved into the code portion 18 and the next character is taken from the extractor 14 and loaded into the extension character portion 14, thus, a new string is started comprising two one character strings. These two new one character strings comprise a pointer address that may or may not constitute a plural character string already observed, but this will be determined by causing the pointer address to read the contents of the dictionary and determined whether a HIT or a NO HIT has occurred as explained hereinbefore.

When the dictionary 11 is initialized with the character code set being used, it is only necessary to load the first two characters in the data stream into portions 18 and 17 to start compressing plural character strings. The pointer addresses for single characters need not be used and the codes for single characters are preferably placed in the lower ordered addresses following the special control characters. If the 256 character ASCII code set is used, the codes for two character string will start at 259 if three special codes are used and no zero address is used.

When the dictionary 11 is not initialized and the receiver knows the character code set and the protocol, the addresses for the single character codes in the code set may be reserved for the lower order addresses as mentioned. However, since the contents of the single character codes are not addressable by register 16 there will be no last match code in register 22 when the two character address causes a MISS or NO HIT. In this event the single character code is available in string code portion 18 and may be read by controller 39. Another way of producing single character codes when a MISS occurs it is to determine if the single character code in register 18 has been seen before in controller 39 and if not it will be the last match code when a MISS occurs.

Figure 2:
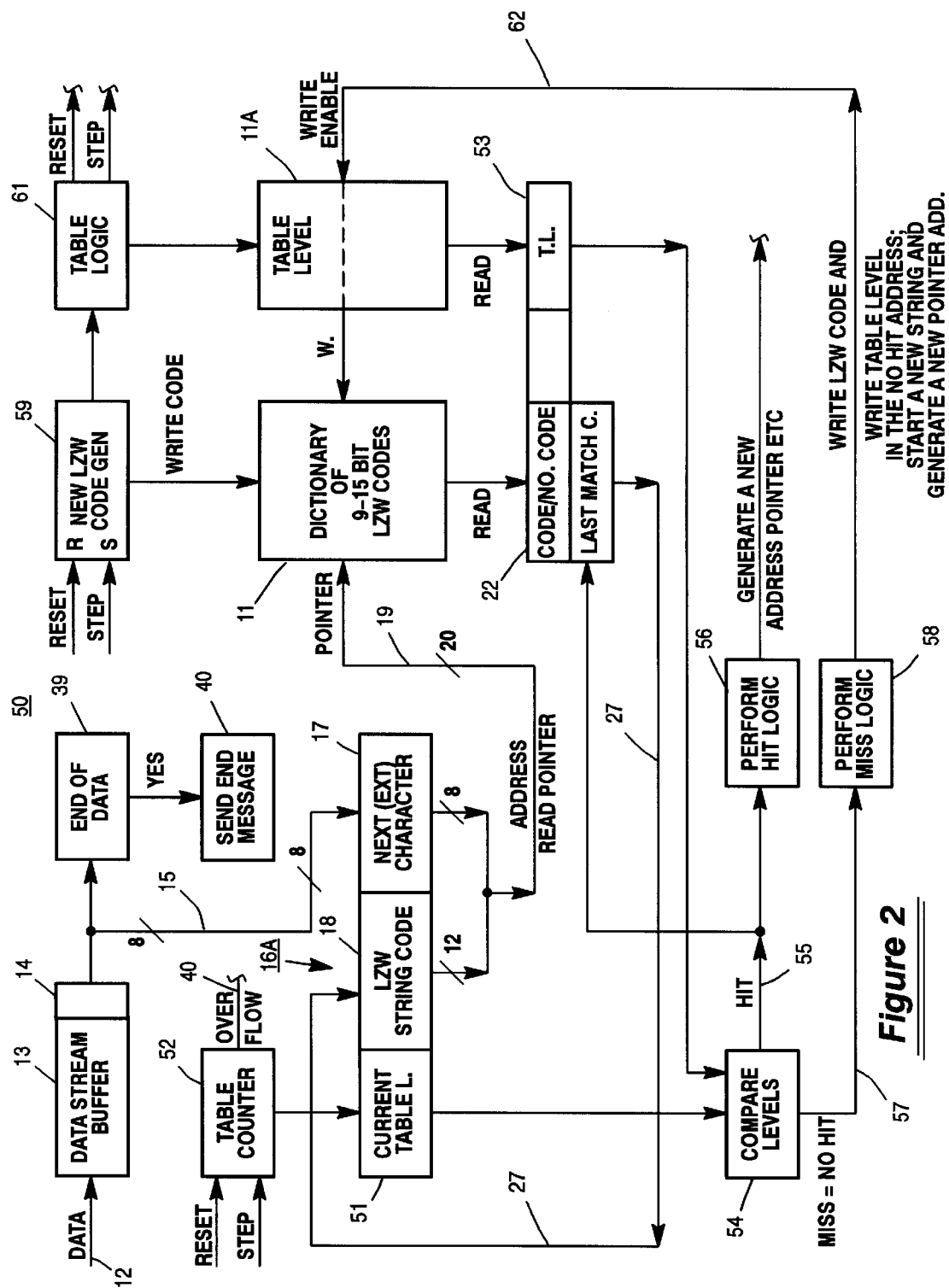
FIG. 2 is a schematic block diagram of a modified embodiment of the data compression system shown in FIG. 1 and showing a table level feature added onto or into the dictionary.

Refer now to FIG. 2 showing a schematic block diagram of a modified embodiment of the data compression system of FIG. 1 in which is employed a table level feature. The data compression system 50 employs a similar or expanded dictionary 11 and a table level designated 11A which may be a part of the dictionary as will be explained hereinafter. Assume for the purposes of this explanation that the data stream on line 12 and in buffer 13 and extractor 14 are the same as those explained hereinbefore. Then the next character will always be available on line 15 to the extension character portion 17 when needed. Similarly the last match code in buffer 22 is available on line 27 to the code portion 18 of the pointer register 16A. In the modified embodiment the pointer register 16A is shown including a table level block 51 which is indexed by a table counter 52 which is shown having reset and set inputs and an overflow output 40. In addition to accessing the dictionary 11 at the pointer address on line 19 there is also provided a table level value in table 11A at the same pointer address as the dictionary pointer address. For example if the table level in 11A is read simultaneously with the contents of the dictionary 11 and stored in table level block 53 it may be compared at logic block 54 with the current table level in block 51. If the table levels compare, there is a HIT and if not there is a MISS or a NO HIT. When the HIT occurs a signal on line 55 initiates the HIT logic in block 56 and causes the system 50 to generate a new pointer address. The generation of the new pointer address is the same as that explained with reference to FIG. 1 where the last match code in buffer 22 is placed in the string code portion 18 of the address pointer register 16A and the extension character or next character in the input stream is supplied to the next character or extension character portion 17 of address pointer register 16A from the extractor 14.

However, if a MISS occurs in the table level logic even though there could have been a comparison or a code present in the dictionary 11, there is a MISS, and the system 50 performs MISS logic as shown by lines 57. MISS logic 58 causes the code generator 59 to write the next string code and the table logic 61 to write the current table level at block 51 into the dictionary 11 and table level 11A at the pointer address.

The new string code to be written in the dictionary 11 is being stepped by the logic block 59 and the code is available to the dictionary 11 to be written at the address pointer location. Similarly, the table logic 61 provides the current table level similar to block 51 and is written into the same location at the table level by the write enable signal on line 62.

It will now be understood that even though there is data in dictionary 11 at the pointer address there is not a match or HIT until the table level 11A coincides with and is equal to the current table level in block 51. The purpose for extending the dictionary 11 is to allow the dictionary to be completely filled with string codes until all of the allotted string codes have been used. Even though all of the string codes are used, not all of the address locations in the dictionary 11 are used. For example, if the dictionary has $2^{20}$ accessible address locations there are approximately one million possible addresses. However, if the LZW code only generates codes using $2^{12}$ bits then the number of codes generated by the code generator 59 has approximately 4,096 codes, the dictionary is full when the 4,096 codes have been exhausted. By adding the table level addition to the dictionary 11 it is possible to change the table level when the dictionary is full and start new a complete new sequence of the same string codes that the code generator 59 produces without having to purge or clear the addresses of the dictionary in which the 4,096 string codes have been written. Stated differently, every time the dictionary 11 fills with the maximum number of string codes, the table level 11A is implemented so that a HIT will not occur unless the table level 51 compares to the table level at the pointer address. When a HIT occurs a new pointer address is generated in the same manner as explained with reference to FIG. 1 wherein the last match code on line 27 is placed in the string code portion 18 of register 16A and the next character from the data stream is placed in the next character portion 17 of the register 16A. When the dictionary 11 is full the code generator 59 is reset and the same sequence of string codes is started all over but are now associated with a different table level because the table level logic has set to the next high level by the table counter 52 and the current table level block 51. Depending on the memory chip used, hundreds of table levels are available and the dictionary 11 need not be reset.

Figure 3:
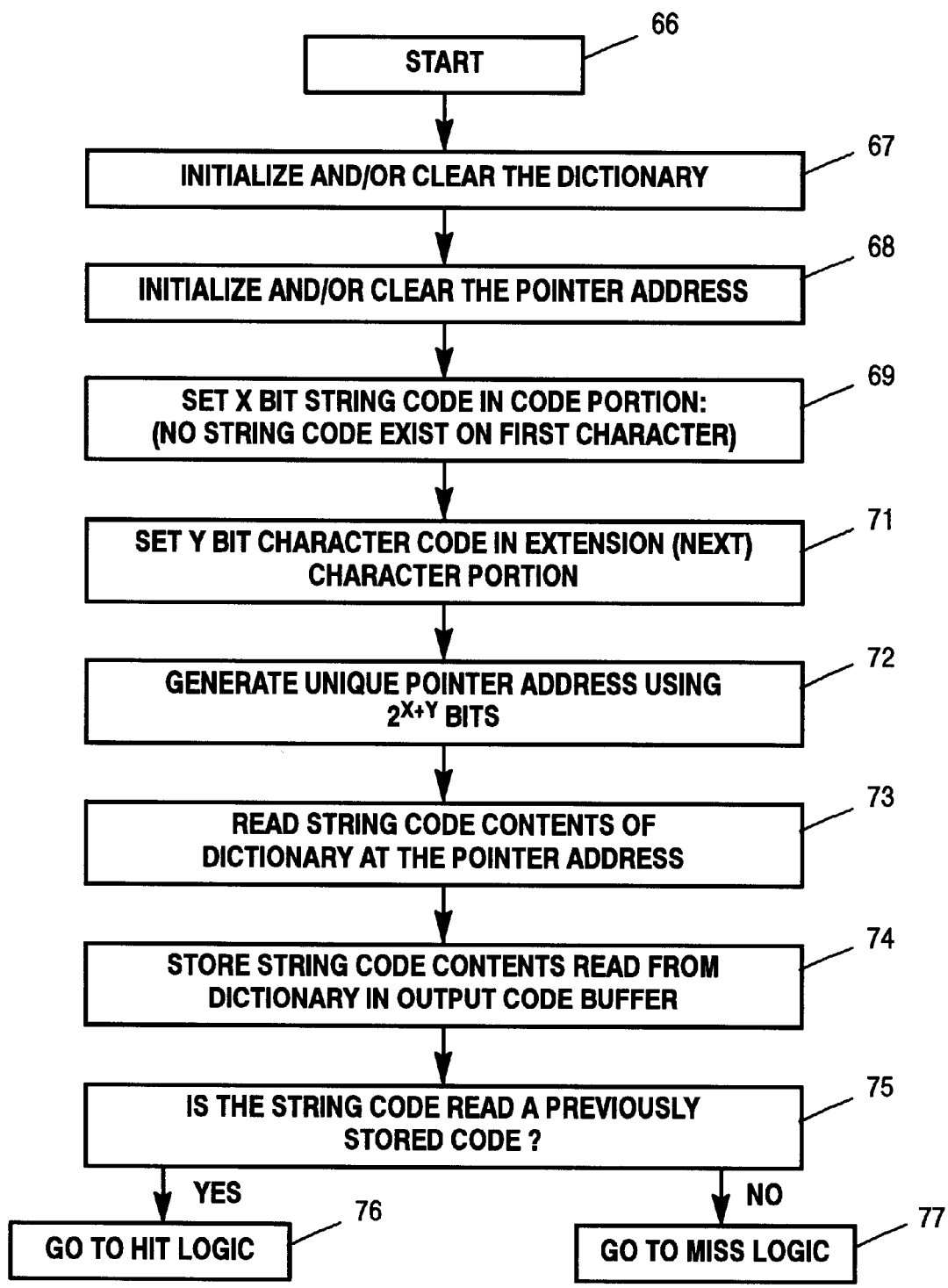
FIG. 3 is a simplified flow diagram showing a sequence of operations employed to limit a dictionary search to a single dictionary pointer address in the data compression system.

Refer now to FIG. 3 showing a simplified diagram of a sequence of operations that are employed to limit a dictionary search to a single address location in the data compression dictionary 11. Block 66 indicates a start operation which begins with the initialization of the dictionary and/or clearing the dictionary as will be explained in greater detail hereinafter at block 67. The next operation is to initialize and/or clear the pointer address and other parts of the system 10 as shown at block 68. The operations begin at block 69 where the "X" bit string code is set in the string code portion 18 of the pointer address register 16. However, no string code exists when the first character is read from the data stream. In block 71 an "Y" bit character code is set in the extension character portion 17. This comprises the second character in the data stream on start up or the second character in data stream for the second read operation. A unique pointer address using the two codes set in the address pointer register are used to generate a unique pointer address having $2^{x+y}$ bits as shown at block 72. At block 73 the contents of the dictionary 11 are read at the pointer address. At block 74 the string codes contents of the dictionary 11 are read into the output buffer 22 as shown at block 74. However, if there are no contents present, then the equivalent of a no contents code is first read into the buffer 22. At block 75 a logic decision is made whether or not the string code read from the dictionary is a previously stored code or the absence of information. In the event a string code is read there is a HIT and proceed to HIT logic as shown at block 76. If no HIT occurs proceed to MISS logic as shown at block 77.

The explanation for FIG. 3 reads directly onto FIG. 1 as well as FIG. 2. In the event that you do not desire to initiate the dictionary 11 it is still possible to use the same sequence of operations provided that the preliminary steps are made as shown in FIG. 3A.

Figure 3A:
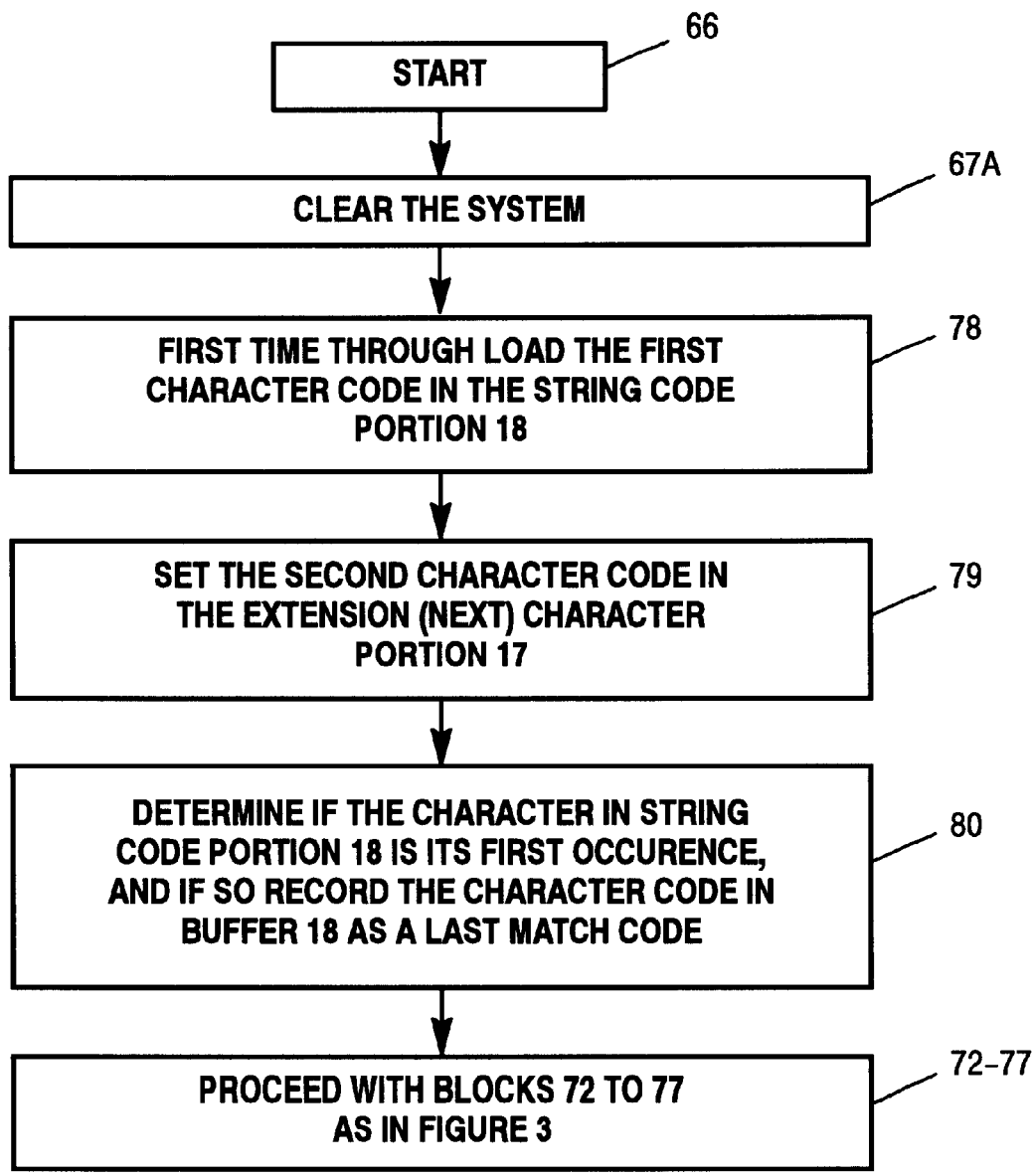
FIG. 3A is a simplified flow sequence of operations showing a modification of FIG. 3 when the dictionary is not initialized.

Refer to FIG. 3A showing the same start block 66. Block 67A shows that the dictionary 11 as well as the system is cleared thus, there is no code information previously recorded in the dictionary 11. However, the code values for the set of characters are reserved by numbers that are known by both the compression system 10 and the decoding system.

At block 78 to start the system 10 the first character in the data stream is loaded into the string code portion 18 of register 16.

At block 79 the second or next character in the data stream is loaded into extension character code portion 17 of register 16.

At block 80 it is determined if the character in string code portion 18 is a single character string and has NOT occurred previously in the stream of data. If NOT the character in portion 18 is loaded into buffer register 22 as a last matched code. This procedure is not the only way of starting data compression system 10 without initializing dictionary 11, but does provide a system 10 that operates the same as when initialized as explained with reference to blocks 72 to 77 after the determination is made in block 80. While which the single character codes could be recorded in the dictionary 11, the address pointer on line 19 would not access them.

At block 78 on the first time through the system shown if FIG. 1 the first character in the data stream is loaded into register 22 and also in the string code portion 18 of the address register 16. Next, the extension character or the second character in the data stream is set in the character code portion 17 of the address register as shown at block 79. Once the system is initiated for start in this manner it will be understood that two distinct and independent characters are set in the pointer address register 16 and that the last match character indicative of the first character of the data stream is set in buffer 22. This modification of FIG. 3 employs the remaining blocks 72–77 which are identical to those described hereinbefore before and do not require additional explanation.

Figure 4:
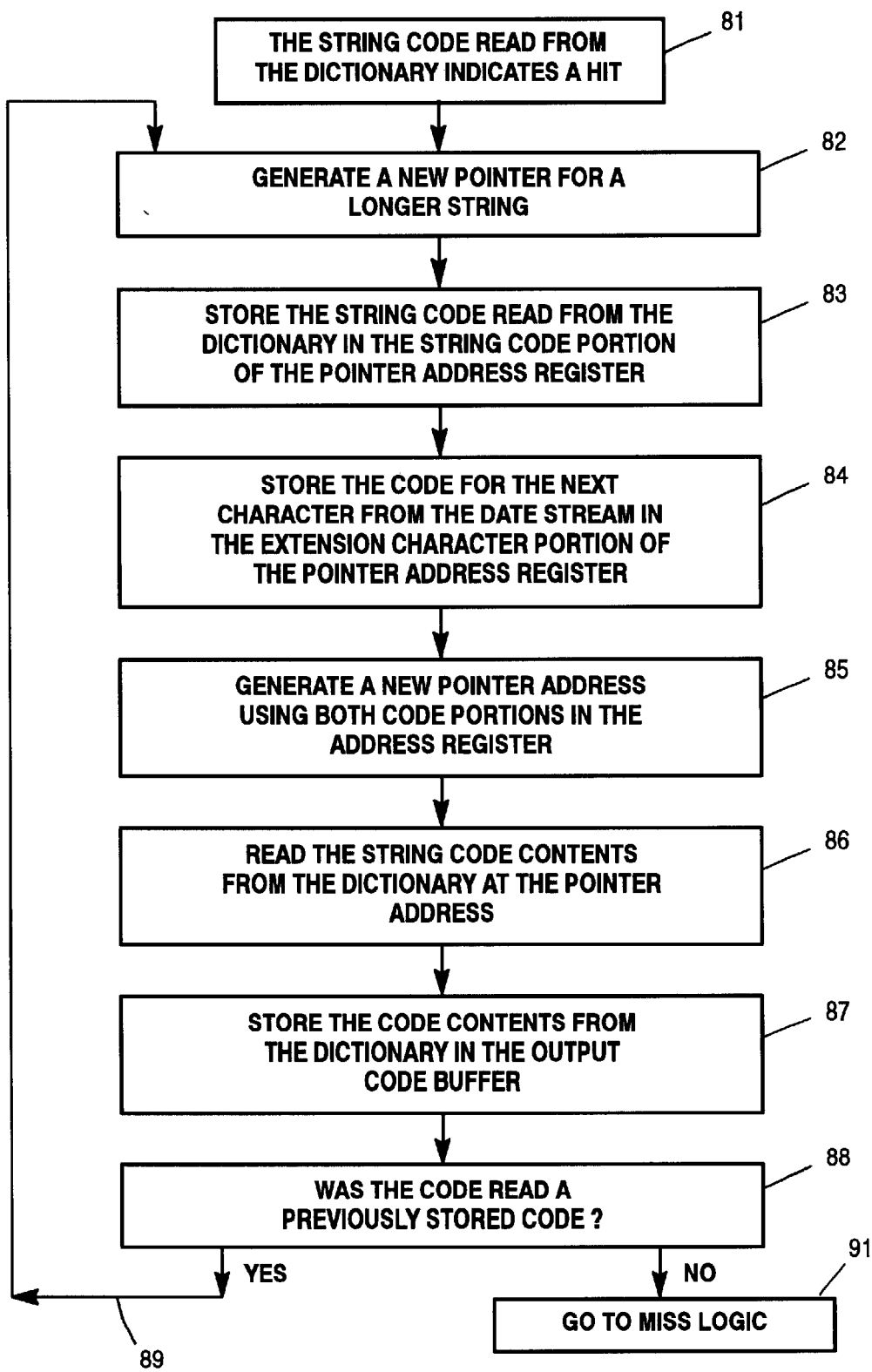
FIG. 4 is a simplified flow diagram showing the sequence of operations employed when the single dictionary pointer address accessed contains a string code resulting in a HIT.

Refer now to FIG. 4 showing a simplified flow diagram having a sequence of operations employed when the single dictionary address accessed contains a string codes resulting in a HIT. Block 81 shows that the string code read from the dictionary 11 indicates a HIT. Block 82 indicates that it is desirable to generate a new pointer for a longer string. Block 83 indicates that the string code read from the dictionary 11 is stored in the address register 16 at portion 18 and block 84 shows that the code for the next character in the input data stream is stored in the extension character portion 17 of the pointer address register 16. Block 85 shows that a new pointer address is generated using the two codes in the pointer address register 16. Block 86 indicates that the new string code contents of the dictionary 11 at the pointer address are read. Block 87 indicates that the code contents of the dictionary are stored in the buffer register 22. Block 88 indicates a logic determination as to whether the information code read from the dictionary 11 comprises a previously stored code. If a code is read from the dictionary there is a HIT on line 89 and the sequence of operations shown in Blocks 82 to 88 is repeated. If there is no HIT, there is a MISS and the sequence of operations now goes to the MISS logic as shown at Block 91.

Figure 5:
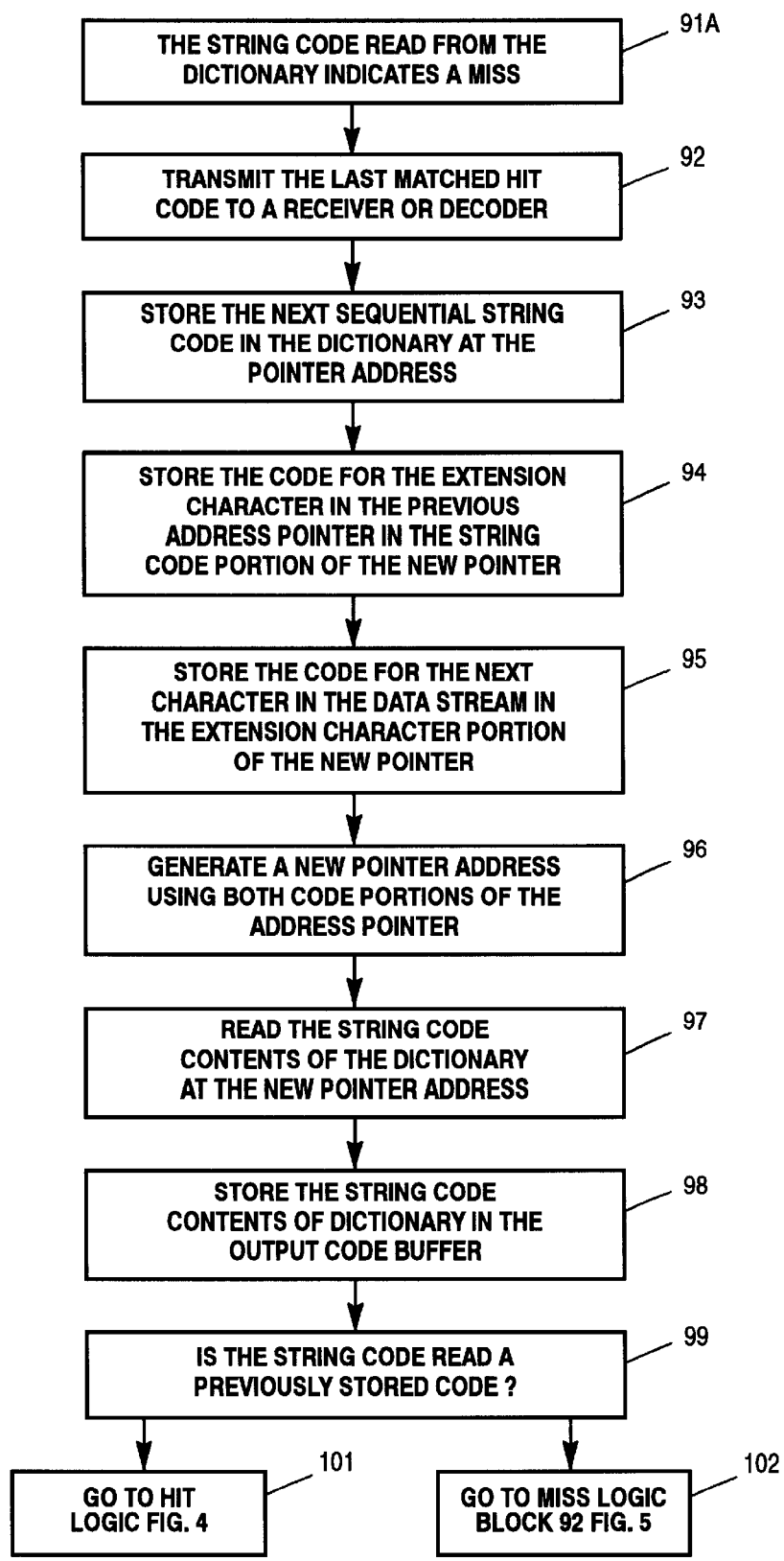
FIG. 5 is a simplified flow diagram showing the sequence of operations employed when the single dictionary pointer address accessed contains no string code resulting in a MISS.

Refer now to FIG. 5 showing a simplified flow diagram and the sequence of operations employed when a single dictionary address accessed contains no string code resulting in a MISS as shown at Block 91A. Block 91A of FIG. 5 follows the logic when a MISS occurs. For purposes of information it will be remembered that when a MISS occurs the string of characters has been extended to point where the last additional character added to the string makes the new string so long that a it is no longer found in the dictionary. When this happens the previous HIT was longest match found in the dictionary. Block 92 shows that this last matched HIT code is transmitted to a receiver or decoder. The last match is held in the register 22 so that it can be output on line 32 to a receiver or decoder 33. Block 93 shows the operation of writing or storing a next sequential code generated by the code generator 59 into the dictionary 11 at the pointer address. It will be understood that the same code in register 18 and the code in the last matched buffer 22 are identical. However, this is not the code that is being written into the dictionary at the pointer address. Block 93 shows that a next sequential code is written into the dictionary 11. It is necessary to generate a new pointer address using the logic shown and described in blocks 94 and 95 wherein the code for the last entered extension character code in address register portion 17 is moved or transferred into the string code portion 18 of the address pointer register 16. A new character or the next extension character is stored in register portion 17 as shown by blocks 94 and 95 respectively. Block 96 indicates that the information in register 16 is then employed to generate a new pointer address using the two code portions loaded in the register 16 as shown in Blocks 94 and 95. Block 97 indicates that the string code contents of dictionary 11 are read from the dictionary at the new pointer address and block 98 shows that the string code contents of dictionary 11 are stored in the output code buffer 22. Block 99 indicates that a logical determination is made as to whether the information read from dictionary 11 comprises a previously stored code and if so the logic goes to Block 101 showing a logical HIT and if not, the logic goes to Block 102 showing a logical MISS. The HIT and MISS logic are shown on FIGS. 4 and 5 respectively and indicated in the Blocks 101 and 102 respectively.

Figure 6:
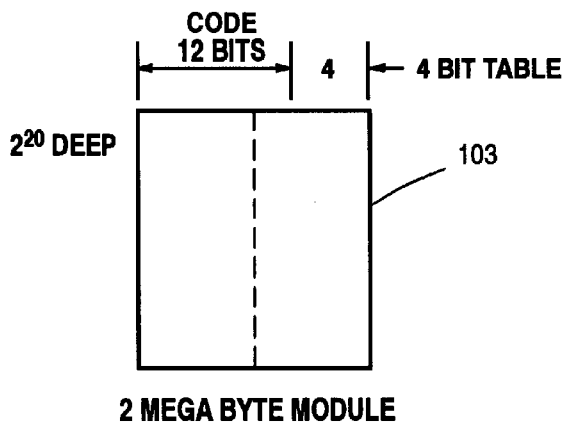
FIG. 6 is a schematic drawing of a block or module of memory used for a dictionary in the present invention.

Refer now to FIG. 6 showing a schematic drawing of a block or module of memory that may be used for a dictionary 11. The module of memory 103 is shown as being $2^{20}$ rows deep and 16 bits wide. The 16 bits may be used for 12 data compression code bits and the last 4 bits reserved for a table level incorporated into a dictionary 11. Thus, two standard blocks of memory approximately one million bits or rows deep and 16 bits wide actually comprise a two megabyte module which may be purchased commercially for approximately $2.00. This assumes that the modules come in 8 bit bytes and when connected together constitutes one 16 bit wide addressable row. As will be explained hereinafter this two-megabyte module may be used for a dictionary in the present invention without modification or may be altered by adding additional 4 or 8 bit bytes to widen the table. When performing LZW data compression it is usual to employ 9 to 12 bits in the LZW code. Seldom is there justification for extending the code bits beyond 13 bits, however, if justified, more code bits can be accommodated in the dictionary by enlarging the dictionary.

Figure 7:
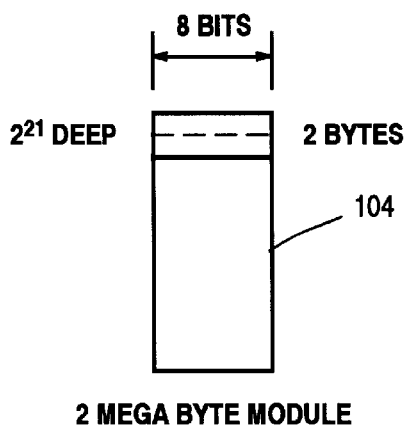
FIG. 7 is a schematic drawing of another block or module of memory configured different from FIG. 6.

Refer now to FIG. 7 showing the same amount of memory as a block or module that is $2^{21}$ bits deep and only 8 bits or one byte wide. In this configuration it is possible to use two rows in a manner in which two 8 bit bytes are connected in series and end up with the equivalent memory storage as that shown in FIG. 6. Each module of memory comprises two megabytes even though connected differently and the cost is the same.

Figure 8:
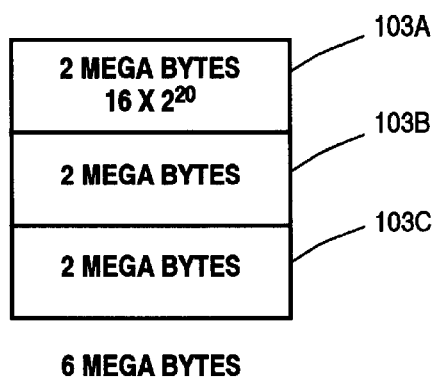
FIG. 8 is a schematic drawing of three blocks or modules of memory of the type shown in FIGS. 6 and 7.

Refer now to FIG. 8 showing a schematic drawing of three blocks or modules of memory of the type shown in FIGS. 6 and 7 comprising two megabytes of memory each and are numbered 103 A, B, and C to indicate that they are of the same type shown in FIG. 6. When a dictionary is constructed using three identical modules 103 A to 103 C it is now possible to operate in one module which is the busy module, have one completely empty module which has been flushed or reset and have another module which was just filled to the maximum number of string codes allowed and not yet flushed.

In the explanation of FIGS. 6–8 the number of bits used for compression codes were shown as 12 bits. Using 12 bits it is only possible to generate 4,096 unique string codes. As explained with reference to FIGS. 1 and 2 even though there are approximately one million addresses, the dictionary is full once the 4,096 unique compression codes have been assigned. It is now possible to use up to all 16 bits of the modules for compression codes when the bit table level 11A system of resetting the dictionary is avoided. For example, in FIG. 6, four of the 16 bits were reserved for the table level operations described with reference to numeral 11A in FIG. 2. Thus, there were only 12 bits remaining to form compression codes. However, if the table level 11A is completely eliminated, all 16 bits are now available for compression codes and it is now possible to generate approximately 65,000 distinct compression codes which will enable the system to generate longer strings if desirable. Since only 65,000 of the possible $2^{24}$ addresses are filled, it is now possible to configure a dictionary of the type shown in FIG. 8 to optimize the number of code compression bits between 9 and 16. Once the dictionary is filled with a maximum number of codes allowed by the number of code bits selected the data compression system transmits a reset code to the decoder or receiver and immediately precedes in the next module 103 B to generate new codes and transmit new strings without having to wait and refresh or flush the module that was filled with compression codes. It may be possible to perform this operation in an alternate manner so that only two modules are used, however, it is assured that one module will always be empty while another module is busy if three modules are provided knowing that the refresh or flush operation may be completed before in the third module before the active module is full.

Having explained a simplified version of arranging commercially available memory to accomplish a dictionary 11 of the type described in the present application, it will be appreciated that the cost of 32 megabytes of memory may now be purchased for approximately $20.00 and the memory of the type described herein will pay for itself in a very short period of time by reducing computer operation time. This is especially true in large computers or mainframe computers.

Figure 9:
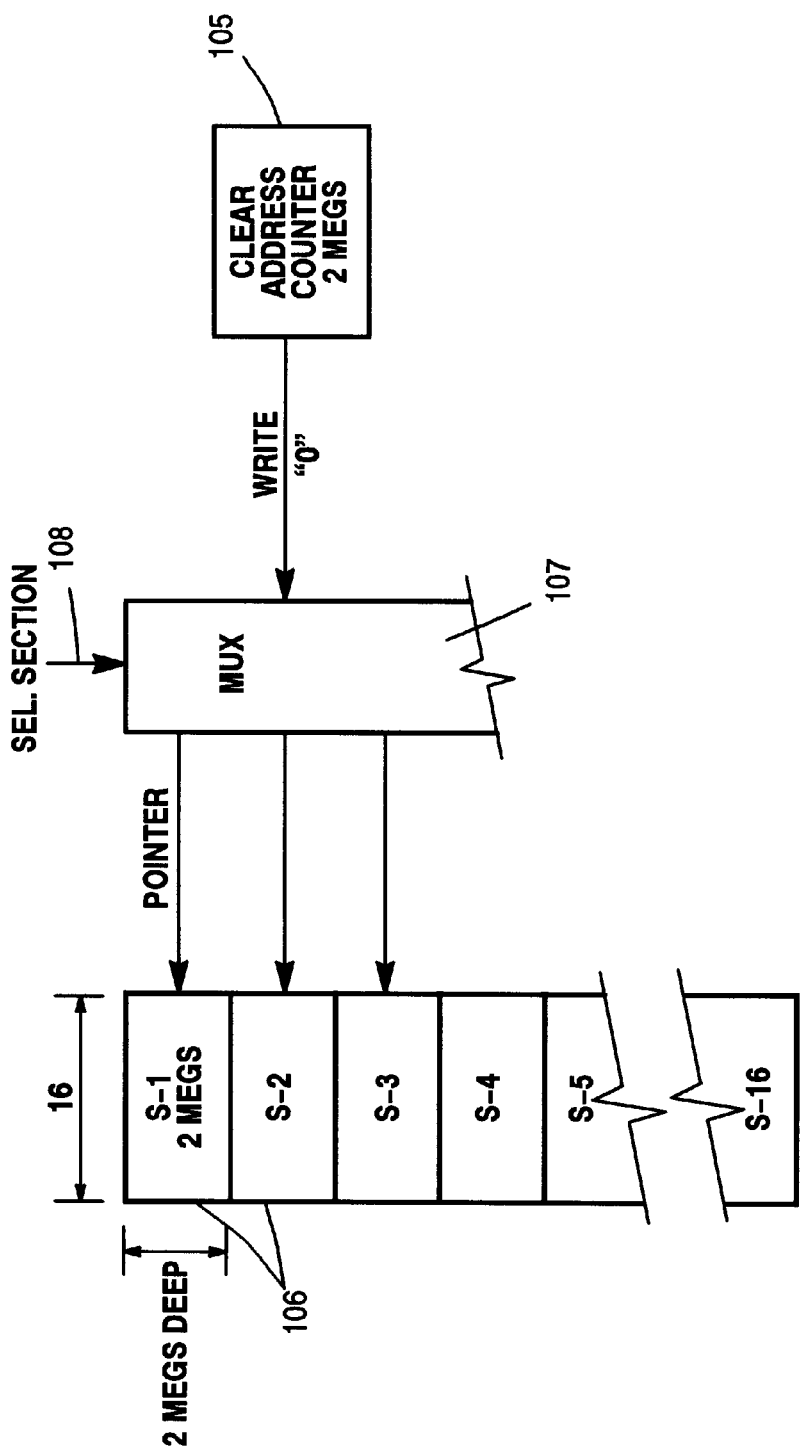
FIG. 9 is a schematic drawing of a large dictionary having a plurality of blocks or modules only one which is operable at any one time showing a structure for clearing blocks when full and not operable.

Refer now to FIG. 9 showing a schematic drawing having large number of sections or blocks or modules similar to those shown in FIG. 8. When it is desirable to refresh or flush a single module, a clear address counter having two megabytes of address generating capacity may be used as shown at block 105. It is preferred to write all zeros in each of the addresses and each of the modules S1 to S16 as shown at numeral 106. A multiplexer 107 having a selection input 108 may be used as a means for pointing to the address in a section to be cleared to the exclusion of other sections. Thus, one section at a time may be selected and zeros written in each of the address locations while other sections of the dictionary are being used for data compression system.

Figure 10:
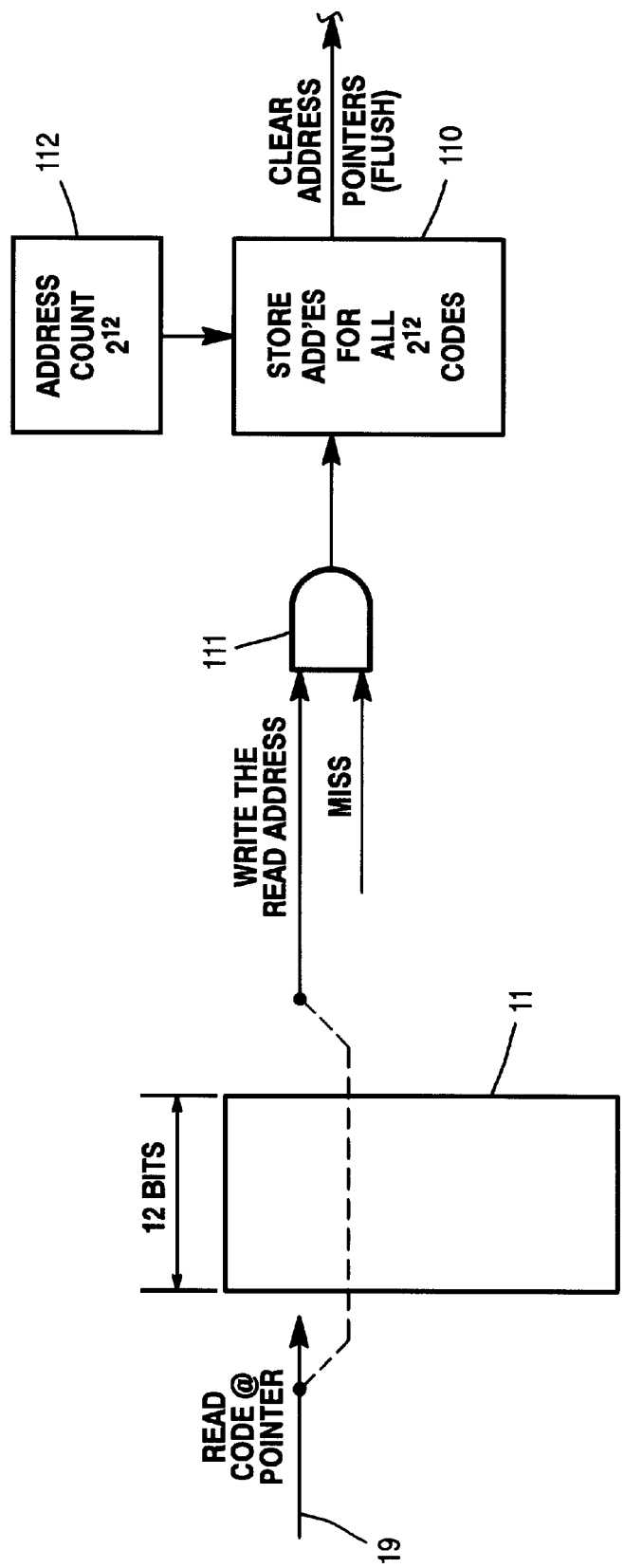
FIG. 10 is a schematic drawing of a dictionary and structure for flushing or clearing the contents of the dictionary when it is desirable to reset the dictionary rapidly.

Refer now to FIG. 10 showing a schematic drawing of a dictionary 11 and an associated structure for clearing the contents of the dictionary which does not require writing over every possible address in the dictionary. When the address pointer on line 19 accesses an address in dictionary 11 it is possible to write the same address into an auxiliary memory 110. An AND gate or similar device 111 is shown operating as a blocking device because it is only necessary to record the address when a MISS occurs. Thus, each time the MISS occurs the address counter 112 counts are stepped in the memory 110 so that the 4,096 addresses in which information is stored during a data compression operation end up stored in memory 110 in some sequential order. It is now possible to use these addresses to generate an address pointer in conjunction with a clear address counter generating all zeros so as to clear only the addresses in which information is known to have been stored.

It will now be observed that the memory required to implement code storage for 4096 addresses may well be embodied in the same modules of memory as used for the dictionary 11.

Having explained the fundamental principals of performing data compression without having to search a dictionary it will be understood that there are numerous ways to implement the system. For example, memory is so cheap presently and becoming cheaper that a dedicated memory may be justified in most applications and if additional speed is needed, some of the steps and operations shown may be executed by a cheap dedicated hardware implementation embodying the algorithms and steps shown in FIGS. 1–5.

Having explained how the table or table level 11A may be eliminated by substituting cheap memory it may be desirable to use the table level implementation when the complete system is executed in the software.

If it is desired to perform data compression on large files using a multiprocessing system, it is possible to optimize the speed of data compression using the present invention and using one of the multiple processors to perform data compression until its memory is full and then switch the data stream to a second processor in the data compression system and continue to perform data compression while the first processor flushes its dictionary.

Major manufactures that transmit sales and inventory to a central processing system will now be able to compress their data in real time and send it faster over links that have sufficient bandwidth. If the communications link is slower than the data compression system, the compressed data can be stored rapidly in a buffer system and transmitted as fast as the link provides without penalizing the computer system performing data compression.

Having explained a preferred embodiment dictionary and address pointer for determining in a single read operation whether or not a code or value has been stored in the dictionary for the string searched it will be understood that the invention may be executed in software in a computer or implemented using hardware and software. There are advantages to initializing the dictionary with the code set of characters as well as not initializing the dictionary when the transmitter and the receiver are both knowledgeable of the code set being used. If there is any doubt, the code set and protocol may be sent before and ahead of the compressed data. When the dictionary is not initialized with the code set, the compressor initially compensates for the lack having single character codes stored in the dictionary. However, as plural character string codes are stored in the dictionary, the novel address pointer will produce the same novel HIT or MISS result. In the modified table level embodiment it is possible to write the same plural string codes in different addresses at different table levels. Since only one table level is valid during data compression operations in which a new sequence of string code values are being written into the dictionary, there is no conflict as long as the correct last matched code is known and read to buffer 22 for writing into register 18 when a HIT occurs. Stated differently, the table level alone at the pointer address can be used to determine if a HIT or a MISS occurred. Following every HIT, the last matched code is available to construct the next pointer address. Following a MISS the next pointer address comprises two single character codes which are available outside of the dictionary, thus, it is only necessary to have the last matched code when a HIT occurs to use table levels to determine a HIT or MISS.

What is claimed is:

1. A method for compressing serial streams of data which includes substituting string code values for known string previously observed in the data stream, characterized by the steps of:

preparing a dictionary having $2^n$ storage addresses to receive said string code values in the memory of some of the $2^n$ storage addresses, storing unique code values for new strings in said dictionary when first observed in said data stream, creating a unique $2^n$ bit dictionary pointer address to be used to determine if the same string being searched already has a string code stored in said dictionary, said pointer address comprising a string code portion corresponding to bits of a code for a known string and an extension character portion corresponding to bits of a code for the next character in said data stream, reading the contents of said dictionary at said one unique $2^n$ bit pointer address, and determining from the contents read at the single $2^n$ bit pointer address whether or not a code value for the memory string being searched is already present in said dictionary.

2. A method as set forth in claim 1 wherein said step of determining comprises:

determining that the contents of said dictionary comprise a string code indicator, creating a new unique pointer address employing the same string code as read from said dictionary, and appending the code for the next character in said data stream to the string code read to form a new pointer address for the next string to be searched.

3. A method as set forth in claim 1 wherein said step of determining comprises:

determining that the contents of said dictionary do not contain a string code for the string being searched at said unique pointer address, and further includes, transmitting the last matched string code found at the previous pointer address to a receiver, and storing a next unique string code in the dictionary at the present pointer address.

4. A method as set forth in claim 3 which further includes:

creating a new unique pointer address comprising the last character code read from the data stream during the previous access, and appending the code for the next character in said data stream to form said new unique pointer address.

5. A method as set forth in claim 3 wherein the step of storing a next unique string code in the dictionary comprises incrementing a code counter to provide a next unique string code.

6. A method as set forth in claim 5 which further includes a step of:

determining if said string code being read from said dictionary is the highest numbered string code to be used to indicate that said dictionary is full.

7. A method as set forth in claim 1 which further includes:

providing a table level memory associated with the contents of said dictionary at each pointer address, setting a level value in said table level memory each time a new unique string code is stored in said dictionary, setting a higher level value in said table level memory when it has been determined that said dictionary is full, and the step of determining from the contents read from said single pointer address further comprises determining that the table level value at the unique pointer address corresponds to a predetermined table level value indicating that the code for the string being searched is present in said dictionary.

8. A method for data compression utilizing a memory dictionary for storing codes for strings of data characters encountered in an input data stream and representing known strings with string codes, characterized by:

storing unique string codes in said memory dictionary representative of known strings of data, generating a $2^n$ bit pointer address indicative of strings of data characters in said input data stream, forming said pointer address comprising bits of the code for the last character in the previous string and appended thereto the bits of the next character from the input data stream forming a two character code string address, reading a string code from the memory said dictionary at said $2^n$ bit pointer address, and generating a new $2^n$ bit pointer address comprising the bits of the string code read from said dictionary and appended thereto the bit code for the next character taken from the input data stream.

9. The method set forth in claim 8 wherein the string code read from said dictionary at said pointer address is representative of a previously occurring string, continuing to generate new pointer addresses, continuing to read previously stored string codes from said dictionary at the new pointer addresses, and extending the length of the strings represented by said address pointers each time a previous string is found.

10. The method as set forth in claim 8 wherein the code read at said new pointer address is representative of no previously occurring string, and generating a new pointer address comprising the code for the last character taken from the previously stored string and the next character from the input data stream appended thereto.

11. The method as set forth in claim 10 which further includes transmitting the last matched string code to a receiver or a decoder, and storing a unique new string code value in the dictionary at the pointer address, said new unique string code value comprising a sequential value generated by a code generator.

12. A data compression system for compressing serial streams of data by substituting codes for known strings of characters in an input data stream, comprising:

pointer address means for searching for codes representative of strings of data in said data stream, said pointer address comprising a known string code portion and a next character code portion wherein the next character is taken from the input data stream and appended as a character code to the string code portion to form a unique pointer address, a string code dictionary having a plurality of addressable memory locations at least one for each possible unique pointer address, said string code dictionary containing a unique string code value for plural character strings observed in said data stream, and means for reading said unique string code values from said string code dictionary at said unique pointer addresses, and means for determining from the contents read from said string code dictionary whether or not a string code exist in said dictionary that is representative of the string of characters in said input data stream and indicated by said pointer address.

13. A data compression system as set forth in claim 12, wherein said means for determining comprises buffer register means for receiving and storing string code values read from said dictionary that are indicative of plural character strings that have previously occurred in said input data stream, and means for transmitting to a receiver the string code for the longest matching string of characters found in said input data stream.

14. A data compression system as set forth in claim 12 wherein said means for determining comprises buffer register means for receiving code values read form said dictionary that are indicative of the absence of a string code in the dictionary at said pointer address, and string code generating means for writing into said dictionary a unique string code value to be substituted for said string of characters in said input data stream indicated by said pointer address.

15. A data compression system as set forth in claim 14 wherein said pointer address means comprises a register for storing pointer addresses having a length equal to $2^n$ bits.

16. A data compression system as set forth in claim 15 wherein said code dictionary comprises a memory having a minimum of $2^n$ pointer addresses.

17. A data compression system as set forth in claim 16 wherein said string code generation means comprises means for generating variable width unique string code values at different pointer addresses, and the number of possible pointer addresses exceeds the number of code values.

18. A data compression system as set forth in claim 12 wherein said string code dictionary comprises memory locations having greater number of bits than the bits employed for said string code values having variable widths.

19. A data compression system as set forth in claim 18 wherein a portion of said memory locations comprise a table for storing table values in unused bits.

20. A data compression system as set forth in claim 12 wherein said string code dictionary further includes an associated table level value memory, and means for resetting said table level values to a higher table level when said dictionary is full of string code values at a lower table level.

\* \* \* \* \*